(12) United States Patent
Cahill-O'Brien et al.

(10) Patent No.: US 7,283,916 B2
(45) Date of Patent: Oct. 16, 2007

(54) DISTRIBUTED UTILITY MONITORING, SUCH AS FOR MONITORING THE QUALITY OR EXISTENCE OF A ELECTRICAL, GAS, OR WATER UTILITY

(75) Inventors: Barry Cahill-O'Brien, Spokane, WA (US); Christopher Osterloh, Waseca, MN (US); Christopher J. Nagy, Waseca, MN (US)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 11/175,963

(22) Filed: Jul. 5, 2005

(65) Prior Publication Data

US 2006/0004679 A1    Jan. 5, 2006

Related U.S. Application Data

(60) Provisional application No. 60/585,391, filed on Jul. 2, 2004.

(51) Int. Cl.
*G01R 22/00* (2006.01)
(52) U.S. Cl. .......................... 702/64; 702/61; 702/62; 324/110
(58) Field of Classification Search .................. 702/64, 702/61, 62
See application file for complete search history.

(56) References Cited

U.S. PATENT DOCUMENTS

| | | | |
|---|---|---|---|
| 4,525,669 A | 6/1985 | Holberton et al. ........... 324/142 |
| 4,988,972 A | 1/1991 | Takagi ......................... 375/259 |
| 5,438,329 A | 8/1995 | Gastouniotis et al. | |
| 5,473,322 A | 12/1995 | Carney | |
| 5,553,094 A | 9/1996 | Johnson et al. .............. 375/130 |
| 5,874,903 A | 2/1999 | Shuey et al. | |
| 5,898,384 A | 4/1999 | Alt et al. | |
| 6,067,029 A | 5/2000 | Durston ................. 340/870.03 |
| 6,100,817 A | 8/2000 | Mason, Jr. et al. | |
| 6,163,276 A | 12/2000 | Irving et al. | |
| 6,181,258 B1 | 1/2001 | Summers et al. | |
| 6,195,018 B1* | 2/2001 | Ragle et al. ........... 340/870.01 |
| 6,219,655 B1 | 4/2001 | Schleich et al. ............ 705/412 |
| 6,229,451 B1 | 5/2001 | Brown ....................... 340/657 |
| 6,232,886 B1 | 5/2001 | Morand | |
| 6,249,516 B1 | 6/2001 | Brownrigg et al. | |

(Continued)

OTHER PUBLICATIONS

GlobalSecurity.org, "Electrical Distribution System Overview," http://www.globalsecurity.org/security/intro/power.htm, 6 pages, no date.

*Primary Examiner*—Hal Wachsman
(74) *Attorney, Agent, or Firm*—Perkins Coie LLP (57) ABSTRACT

In a system for automatic meter reading of utility meters, a utility supply measuring system may include one or more collector units, wherein each one of the collector units accesses a supply of a utility, wherein the accessing occurs in addition to receiving meter reading data from a telemetry device, such as a telemetry device coupled to a utility. In accessing the supply of the utility, the collector unit component may itself be at least loosely coupled to a utility supply, or may communicate with a device that monitors quality, such as an outage detector. A method for transmitting utility supply data for such communications may include continuously transmitting a PN sequence code over a single channel.

9 Claims, 10 Drawing Sheets

U.S. PATENT DOCUMENTS

| | | |
|---|---|---|
| 6,259,972 B1 * | 7/2001 | Sumic et al. ............... 700/286 |
| 6,374,188 B1 * | 4/2002 | Hubbard et al. .............. 702/61 |
| 6,452,490 B1 | 9/2002 | Garland et al. |
| 6,452,986 B1 | 9/2002 | Luxford et al. |
| 6,477,558 B1 | 11/2002 | Irving et al. |
| 6,512,463 B1 | 1/2003 | Campbell et al. |
| 6,628,207 B1 * | 9/2003 | Hemminger et al. ... 340/870.02 |
| 6,677,862 B1 | 1/2004 | Houlihane et al. |
| 6,700,902 B1 | 3/2004 | Meyer |
| 6,778,099 B1 | 8/2004 | Meyer et al. |
| 6,888,876 B1 | 5/2005 | Mason, Jr. et al. |
| 6,963,285 B2 * | 11/2005 | Fischer et al. .............. 340/635 |
| 7,012,546 B1 * | 3/2006 | Zigdon et al. ......... 340/870.02 |
| 2002/0063635 A1 * | 5/2002 | Shincovich ............ 340/870.02 |
| 2002/0071478 A1 * | 6/2002 | Cornwall et al. ........... 375/132 |
| 2002/0109607 A1 * | 8/2002 | Cumeralto et al. .... 340/870.02 |
| 2004/0021568 A1 | 2/2004 | Seal et al. |
| 2004/0125889 A1 * | 7/2004 | Cumeralto et al. ......... 375/303 |
| 2005/0068193 A1 | 3/2005 | Osterloh et al. |
| 2005/0239414 A1 * | 10/2005 | Mason et al. ................. 455/69 |

* cited by examiner

DISTRIBUTED UTILITY MONITORING, SUCH AS FOR MONITORING THE QUALITY OR EXISTENCE OF A ELECTRICAL, GAS, OR WATER UTILITY

CROSS-REFERENCE TO RELATED APPLICATION

This application claims priority to U.S. Provisional Patent Application No. 60/585,391, filed Jul. 2, 2004, entitled "DISTRIBUTED UTILITY QUALITY MONITORING, SUCH AS FOR MONITORING ELECTRICAL POWER QUALITY," which is herein incorporated by reference.

BACKGROUND

Utility companies (e.g., electrical, gas, and water utilities) are chartered with delivering a high quality of service to their customers. For example, in the case of an electrical utility, quality of power can refer to power delivered within a certain voltage range. In addition, it can refer to the number of interruptions and transient disturbances that take place over a given time period, which are ideally minimized. In some areas, local codes or ordinances mandate the quality of the power supply.

Some of the factors that may affect the quality of power delivered to customers include local voltage reductions and noise from switching circuits. In addition, defective or worn equipment can also cause problems, along with tree limbs growing through power lines and countless other power line disturbances. Problems with power line quality can lead to customer complaints and, in some cases the customer can lose all service (e.g., during failure of a defective transformer).

Typically, electric utility, companies use a grid of power lines and control transformers in an attempt to achieve a high quality supply of power. Utility companies may also measure power quality at major substations. However, attempts to solve monitoring quality at a high level are often not effective because loss of power and poor power quality is typically a local phenomenon that usually only affects a small number of customers connected to a local feeder line.

In some cases, lower level monitoring (e.g., at the neighborhood level) is done on a case-by-case basis. However, local monitoring on an ongoing and distributed basis may be considered not feasible because of the high cost involved in implementing an infrastructure for performing such monitoring.

BRIEF DESCRIPTION OF THE DRAWINGS

In the drawings, the same reference numbers identify identical or substantially similar elements or acts. To easily identify the discussion of any particular element or act, the most significant digit or digits in a reference number refer to the figure number in which that element is first introduced (e.g., element 204 is first introduced and discussed with respect to FIG. 2).

DETAILED DESCRIPTION

The invention will now be described with respect to various embodiments. The following description provides specific details for a thorough understanding of, and enabling description for, these embodiments of the invention. However, one skilled in the art will understand that the invention may be practiced without these details. In other instances, well-known structures and functions have not been shown or described in detail to avoid unnecessarily obscuring the description of the embodiments of the invention.

It is intended that the terminology used in the description presented be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

A. Overview

A system and method for monitoring utility quality on a distributed level enables a utility provider to monitor the quality of power or another utility (e.g., gas, water, etc.) as it is delivered locally throughout a network. In some embodiments, the system and method is deployed, at least in part, in a fixed network wireless meter reading system. The fixed network wireless meter reading system uses a large number of networked collector nodes (e.g., cell control units (CCUs)), to read meter data from its customers. The collector nodes may be mounted on poles or other high structures. While, in some embodiments, each collector node's primary function is to collect radio transmissions emitted from radio transponder units located on customers' utility meters, each collector node can also be configured to monitor the quality of a supply associated with the metered utility. In this way, the collector nodes, which form a distributed system spanning a geographic area, can provide the utility provider with an almost real-time view of the quality of the utility as it is delivered to the customers.

In some embodiments configured for electrical power monitoring, each collector node in the distributed system is equipped with a voltage-sensing device such as a transformer or resistor network with the appropriate signal conditioning. A microprocessor coupled to the voltage-sensing device collects the voltage data, possibly along with other power quality data. For example, the voltage-sensing device detects when the voltage falls outside limits determined to be acceptable for power quality in the area. When this occurs, the microprocessor may log details of the occurrence along with a time and duration of the occurrence.

In alternative embodiments for monitoring the quality of a utility, a collector node can perform functionality associated with monitoring one or more outage devices that, for example, continually transmit a code sequence (e.g., a pseudo-random number/noise code sequence) on a given channel. The collector node may perform correlation (or the like) to determine the quality of the utility being delivered during given time periods. For example, in the case of an electrical utility, successful correlation may mean that the utility is being delivered normally, whereas unsuccessful correlation may indicate a power outage in a particular locale associated with the one or more outage devices.

In some embodiments, each collector node in the distributed system sends collected quality data to a central system or host processor for analysis by the utility provider. Each collector node may send collected quality data together with, or in addition to, collected meter data. Once the quality data reaches the host processor, technicians compare the received data with data the utility provider collects about power sent into the area. In some embodiments, the system uses computer applications or other automated systems to perform some or all of this analysis and comparison. In light of the described techniques, the utility provider can use the distributed system to immediately detect problems in utility quality and can then dispatch a repair crew to diagnose and repair any problems.

One of the advantages of using the described network of collector nodes to monitor quality of the utility is that in many cases, the utility provider has already established the network of collector nodes to read meter data. By utilizing this existing infrastructure and making some straightforward modifications (e.g., changes to the collector nodes, the transmitter nodes that the collector nodes are receiving signals from, or both) the utility provider can implement distributed quality monitoring without having to create an entirely new infrastructure from the ground up. In areas where utility providers have yet to implement automatic meter-reading networks, the efficiency that comes with establishing a multipurpose infrastructure makes implementation more cost-effective. Thus, by utilizing the infrastructure of meter data collection devices, providing the distributed quality monitoring system becomes relatively straightforward and feasible.

B. Example System Architecture

Figure 1A:
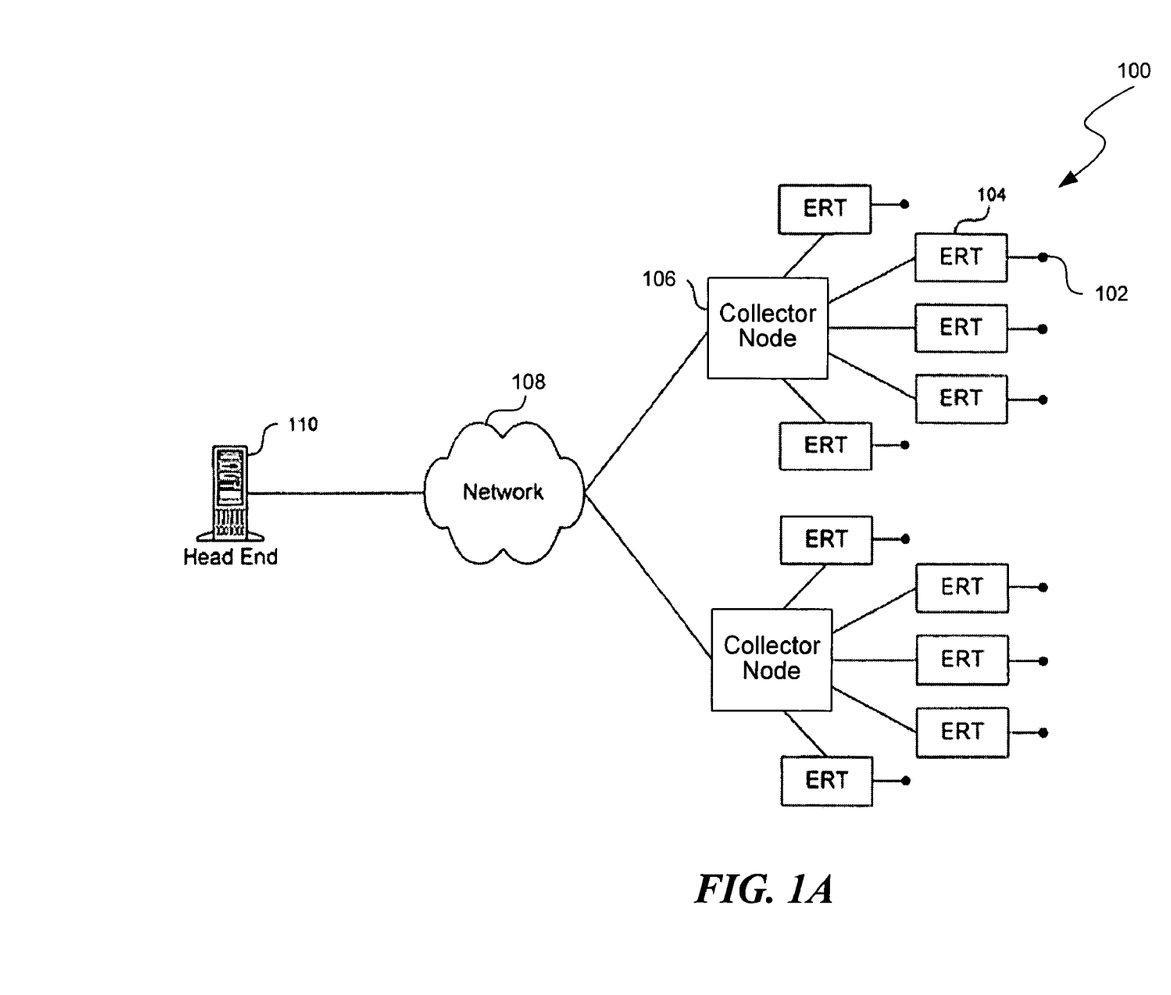
FIG. 1A is a block diagram showing a first example of a system on which the distributed quality monitoring technique can be implemented in one embodiment.
Figure 1B:
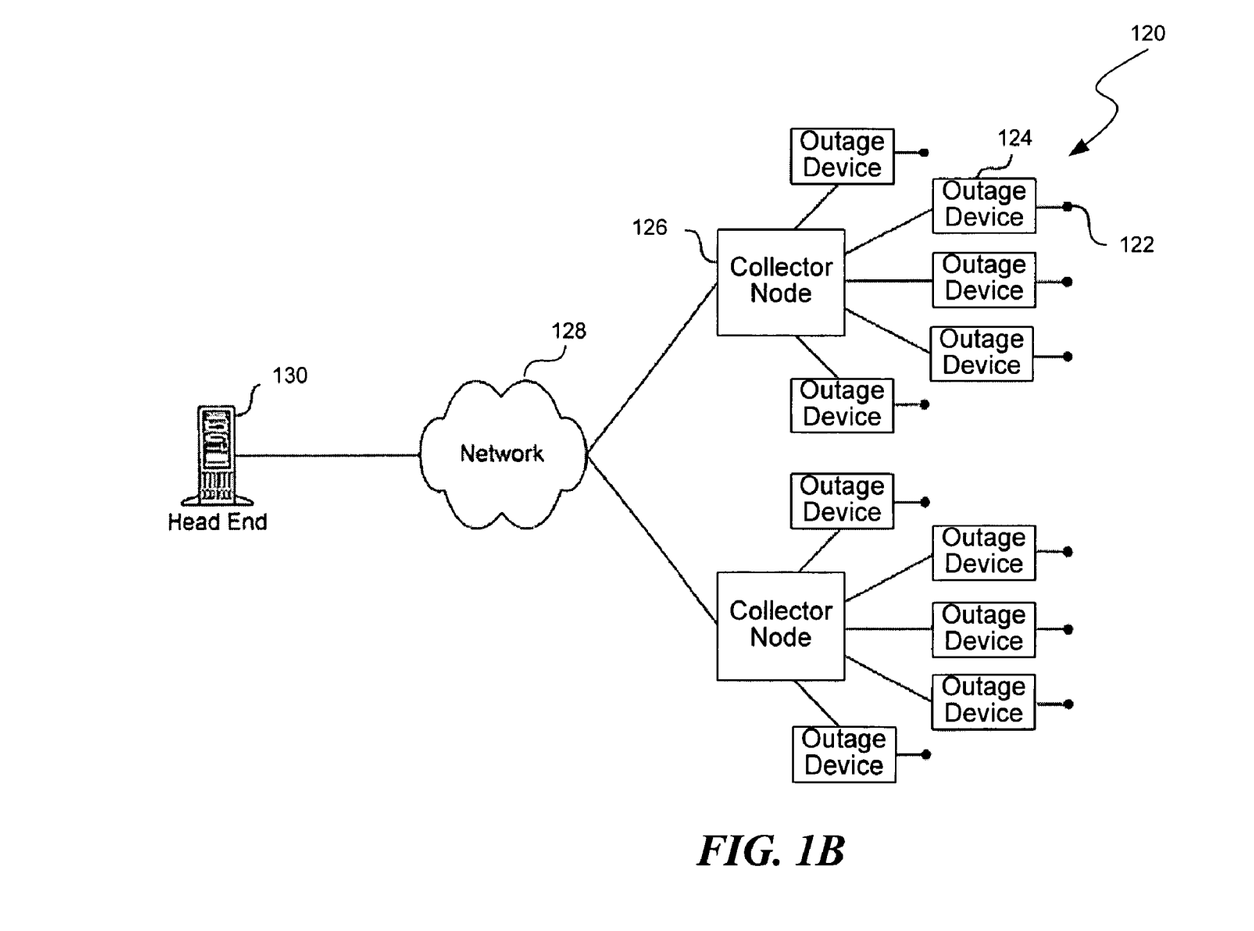
FIG. 1B is a block diagram showing a second example of a system on which the distributed quality monitoring technique can be implemented in one embodiment.

FIGS. 1A and 1B and the following discussion provide a brief, general description of a suitable environment in which the invention can be implemented. Although not required, aspects of the invention are described in the general context of computer-executable instructions, such as routines executed by a general-purpose computer (e.g., a server computer, wireless device, or personal computer). Those skilled in the relevant art will appreciate that the invention can be practiced with other communications, data processing, or computer system configurations, including: Internet appliances, hand-held devices (including personal digital assistants (PDAs)), wearable computers, all manner of cellular or mobile phones, multi-processor systems, microprocessor-based or programmable consumer electronics, set-top boxes, network PCs, mini-computers, mainframe computers, and the like. Indeed, the terms "computer," "host," and "host computer" are generally used interchangeably, and refer to any of the above devices and systems, as well as any data processor.

Aspects of the invention can be embodied in a special purpose computer or data processor that is specifically programmed, configured, or constructed to perform one or more of the computer-executable instructions explained in detail herein. Aspects of the invention can also be practiced in distributed computing environments where tasks or modules are performed by remote processing devices, which are linked through a communications network. In a distributed computing environment, program modules may be located in both local and remote memory storage devices.

Aspects of the invention may be stored or distributed on computer-readable media, including magnetically or optically readable computer discs, as microcode on semiconductor memory, nanotechnology memory, or other portable data storage medium. Those skilled in the relevant art will recognize that portions of the invention reside on a server computer, while corresponding portions reside on a client computer, such as a mobile device.

Referring to FIG. 1A, a suitable system on which the system and method of distributed utility quality monitoring may be implemented includes a meter-reading data collection system 100 having multiple meters 102 coupled to utility-consuming devices (not shown), such as electric-, gas-, or water-consuming devices. In the illustrated embodiment, each meter 102 includes a radio transceiver module (ERT) 104, which serves as a data collection endpoint. The ERTs 104 encode consumption, tamper information, and other data from the meters 102 and effectively communicate such information, (e.g., using a transmitter (not shown)), to a collector node 106 (e.g., cell control unit (CCU)).

The communication of this data may be accomplished via radio-to-radio data collection systems, such as hand-held, mobile automatic meter reading or fixed network. In some embodiments, the collector nodes 106 are implemented as neighborhood concentrators that read the ERTs 104, monitor power quality, process data into a variety of applications, store data temporarily, and transport data to a head end system 110 associated with the utility provider.

Figure 2:
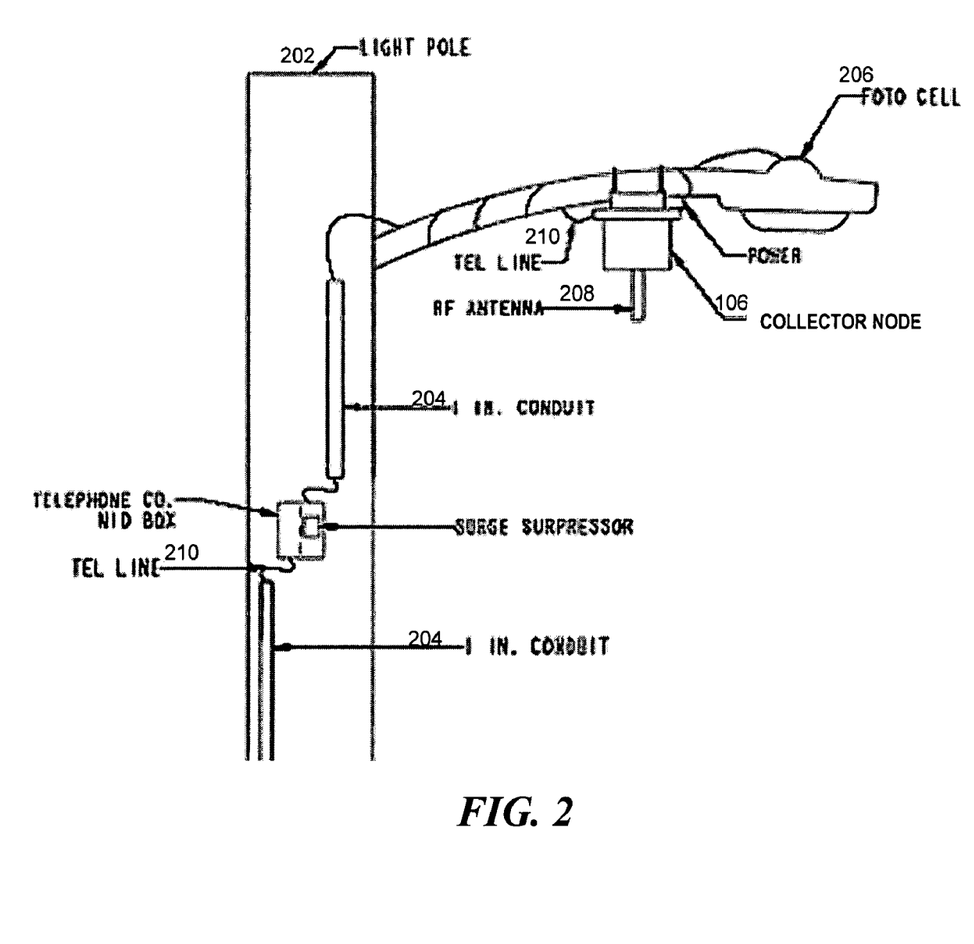
FIG. 2 is a block diagram showing a more detailed view of a portion of the system of FIG. 1A including the collector node.

In some embodiments, the collector nodes 106 can be installed on existing structures associated with, or near to a supply of the utility. For example, with respect to an electrical utility, the collector nodes 106 can be installed on power poles or street light arms (as shown in FIG. 2). Likewise, with respect to gas or water utilities, the collector nodes may be installed on pit lids or the like. In this way, the collector nodes 106 can be coupled directly to or very close to local utility supplies, and can thus, monitor the supply of the utility, as well as collect more typically utility data (e.g., meter information), as described above. While multiple collector nodes 106 are shown in FIG. 1A, other implementations may include only a single collector node. In some embodiments, the collector node may even be coupled to or associated with a server that gathers data and monitors status of the utility.

Because it can handle utility quality information as well as meter data, the collector nodes 106 may provide both quality data and meter data to the utility head end system 110 via periodic uploads over a network 108. This may occur on an ongoing basis (e.g., every half-hour) or as otherwise needed (e.g., immediately in the case of an outage or other quality problem), or even continuously.

Referring to FIG. 1B, an alternative system on which the system and method of distributed utility quality monitoring may be implemented includes a meter-reading data collection system 120 having multiple meters 122 coupled to utility-consuming devices (not shown), such as electric-, gas-, or water-consuming devices. In the illustrated embodiment, each meter 122 is linked to an outage reporting device 124, which links to a radio transceiver module (not shown) capable of transmitting outage data (and possibly other data) to a collector node 126 (e.g., cell control unit (CCU)). To allow for efficient use of bandwidth, the collector nodes 126 may be configured to receive information from multiple outage reporting devices on a single channel. For example, in some embodiments, each collector node 126 may be configured to repeatedly receive a long pseudo-random number/noise (PN) sequence from each outage reporting device 124. By correlating on the received sequence over a set time period that corresponds to the length of the PN sequence, the collector nodes 126, in this example, can determine whether an outage or other quality problem has occurred.

Further details about the meter-reading system of FIGS. 1A and 1B, and similar systems can be found in the following commonly assigned patent applications: U.S. patent application Ser. No. 09/911,840, entitled "Spread Spectrum Meter Reading System Utilizing Low-speed/ High-power Frequency Hopping," filed Jul. 23, 2001, currently pending; U.S. patent application Ser. No. 09/960,800, entitled "Radio Communication Network for Collecting Data From Utility Meters," filed Sep. 21, 2001, now U.S. Pat. No. 6,653,945; and U.S. patent application Ser. No. 10/024,977, entitled "Wide Area Communications Network for Remote Data Generating Stations," filed Dec. 19, 2001, abandoned, which are herein incorporated by reference.

Referring to FIG. 2, the collector node 106 of FIG. 1A may be fixed on a street light pole or other fixture 202, along with other related components. The related components include various conduits 204 that house wiring to feed power to the light. The collector node 106 monitors this power supply for quality, but may also rely on it to power its own processes. In the illustrated embodiment, a rechargeable battery (not shown) provides backup power, and a solar photocell 206 is used as an outlet into which the collector node 106 may be plugged into. The photocell 206 may be used to turn on the street light at night, and has power coming to it via the power conduit in the light pole 204. In some embodiments, the photocell 206 can be unscrewed, and a special adapter screwed in to the outlet. The photocell 206 is then screwed into the special adapter, allowing it to control the street light. With the adapter in, the collector node 106 can be fed from the power in the pole, rather than having to add new wiring to the pole, to install the collector node 106.

The related components further include an antenna 208 for emitting and receiving RF signals so that the collector node 106 can communicate with the ERTs 104. The related components may also include a telephone line 210 and box 212 to facilitate the collector node's connection to the network 112 so that it can pass collected data (e.g., quality data, meter data, etc.) to the head end system 110, as illustrated in FIGS. 1A and 1B. In alternative embodiments, other network connection techniques may be used such as high-speed cable, DSL, wireless, etc.

Figure 3:
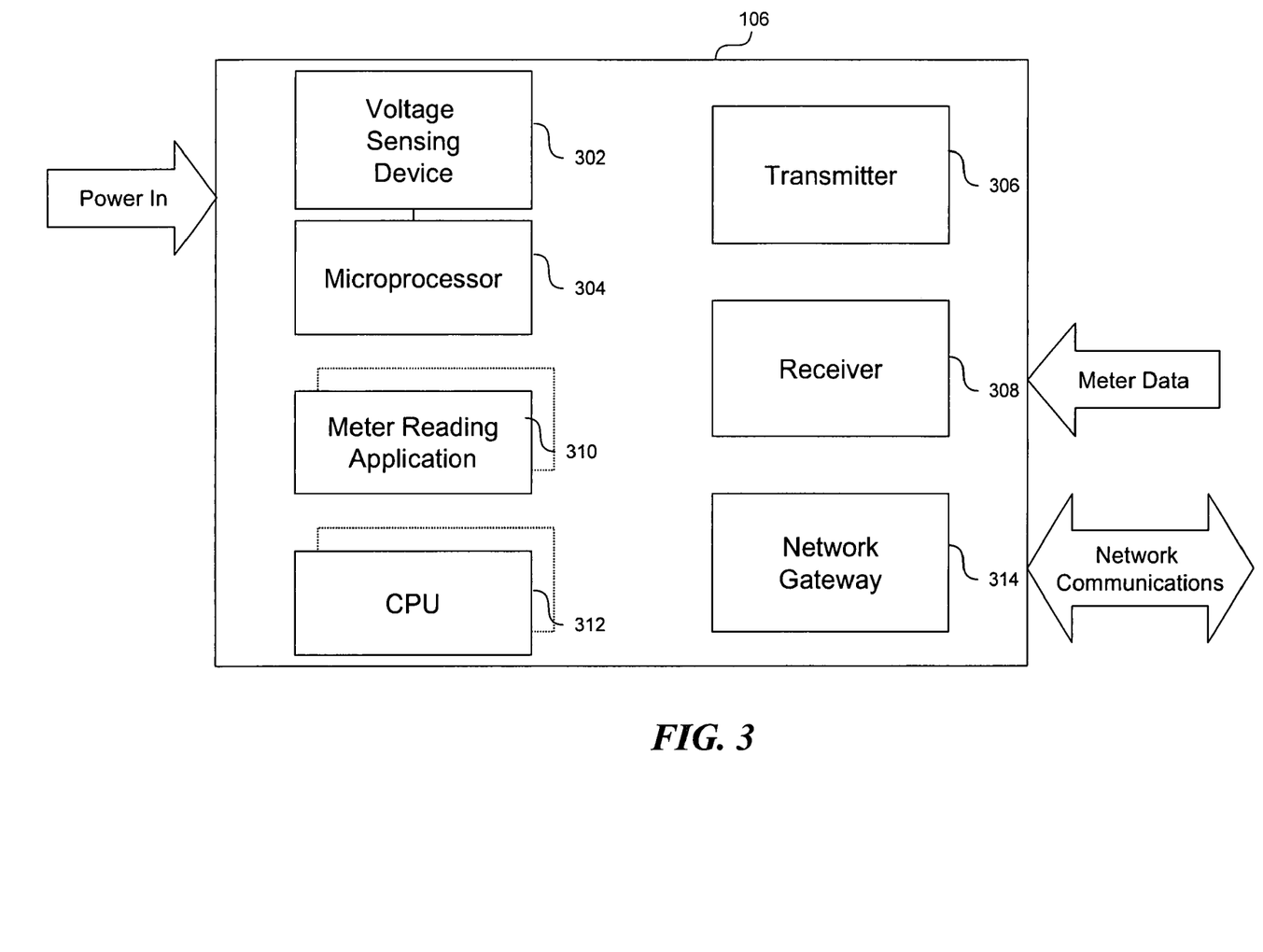
FIG. 3 is a block diagram showing a more detailed view of the collector node of the system of FIG. 1A.

Referring to FIG. 3, the collector node 106 of FIG. 1A includes various components. In the illustrated embodiment configured for monitoring of electrical power supply, the collector node 106 includes a voltage-sensing device 302. Both analog sensing and digital sensing techniques may be used to implement the voltage-sensing device 302, as described in more detail with respect to FIGS. 4 and 5. The voltage-sensing device 302 may sense various types of information including basic measurements of voltage and frequency of power. For example, the voltage-sensing device 302 may measure fluctuations in voltage as well as transient noise or interruptions and spikes in voltage.

A microprocessor 304 coupled to the voltage-sensing device 302 collects the voltage data as it relates to the voltage delivered to the collector node 106, and may store it in some sort of memory device (not shown). By detecting when the voltage falls outside acceptable limits for power quality in the area, the microprocessor 304 logs details of the occurrence, along with the time and duration of the occurrence. The type of information that may be of interest to the utility provider may include information about the timing of voltage irregularities, such as how long power was reduced or increased to unacceptable levels. Also of interest may be the duration or frequency of noise events, interruptions, or spikes.

The collector node 106 may also include a transmitter 306, receiver 308, and a meter reading application or applications 310 to facilitate meter reading based on ERT-equipped meters or other devices. In addition to the microprocessor 304, the collector node 106 may also include one or more CPUs 312 for handling meter data and for facilitating network communication with the head end system 110. The collector node 106 may also include a network gateway 314 to further facilitate network communications with the head end system 110.

Figure 4:
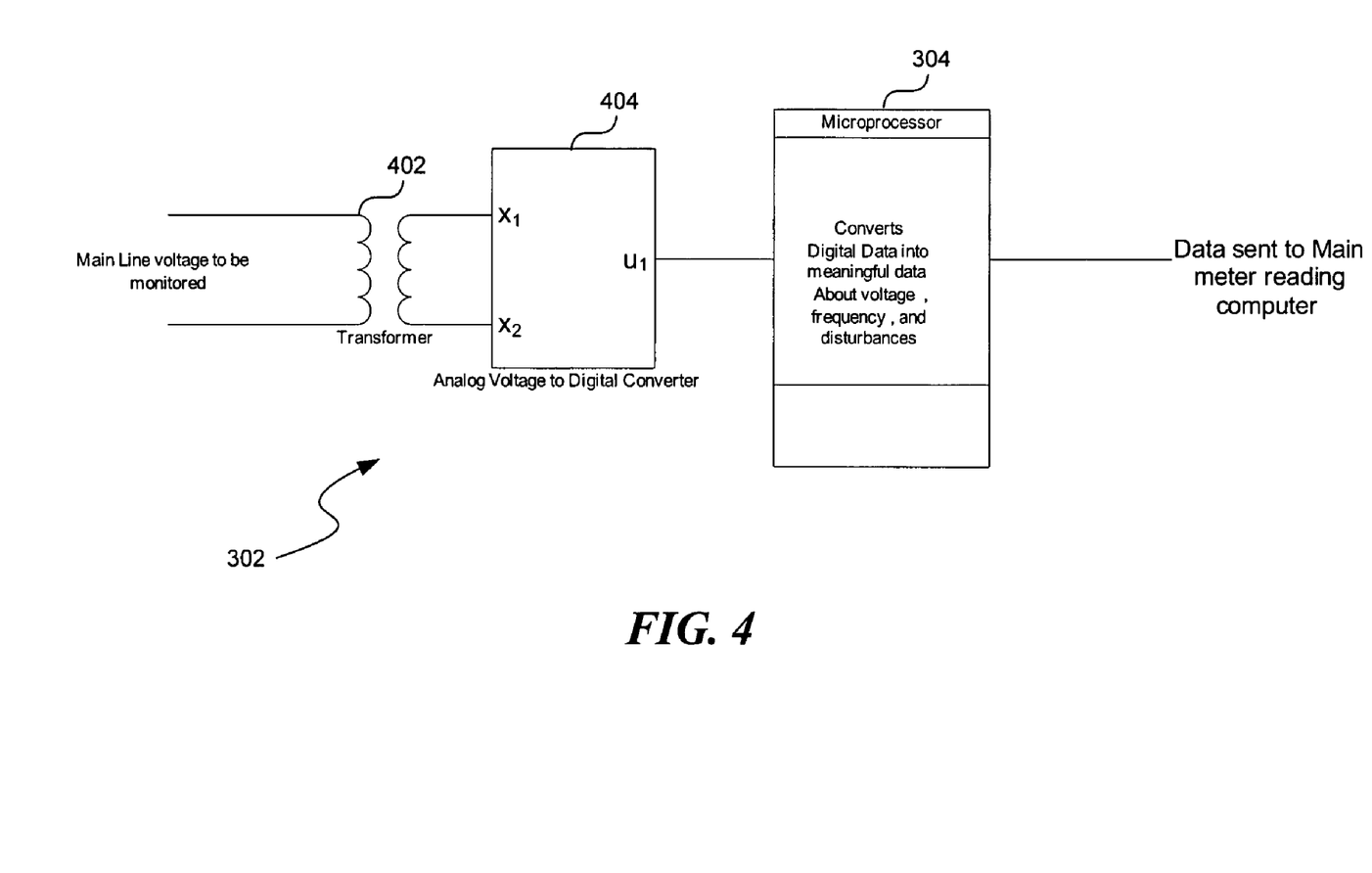
FIG. 4 is a circuit diagram showing an example of the voltage-sensing device and microprocessor of the collector node of the system of FIG. 1A.
Figure 5:
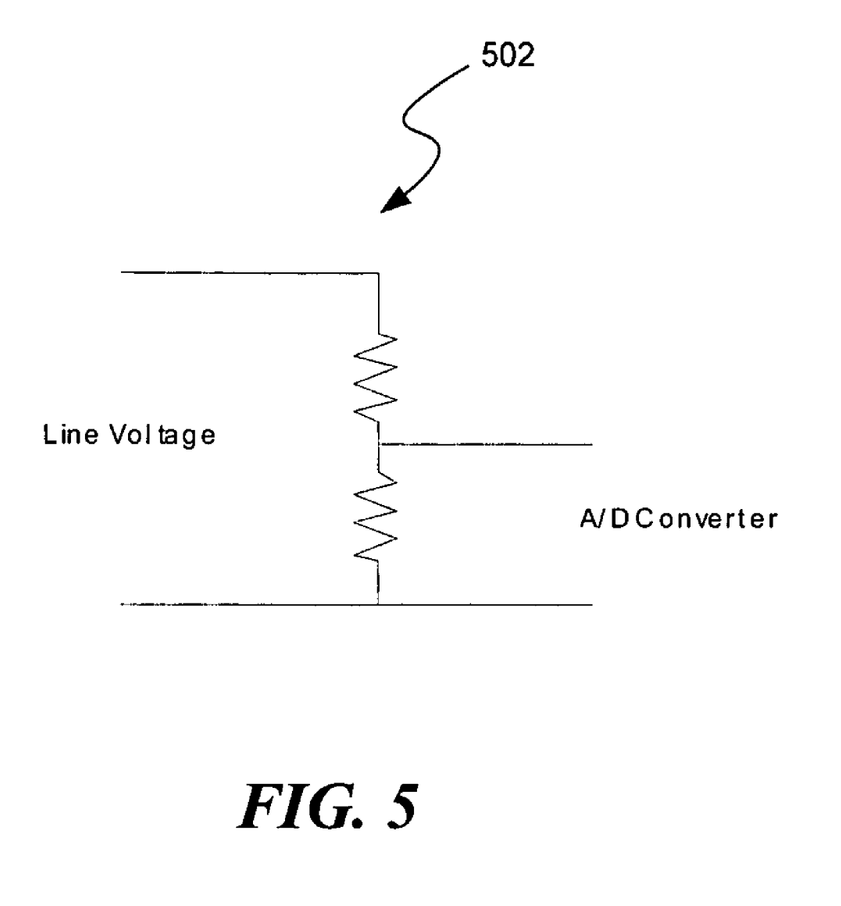
FIG. 5 is a circuit diagram showing an alternate example of the voltage-sensing device and microprocessor of the collector node of the system of FIG. 1A.

Referring to FIGS. 4 and 5, the voltage-sensing device 302 of FIG. 3, together with the microprocessor 304, monitors the power in the collector node 106. The voltage-sensing device may be implemented using transformers 402, as shown in FIG. 4, or using a series of resistors forming a circuit 502, as shown in FIG. 5. With digital sensing techniques, an analog-to-digital converter may be used, in conjunction with a software algorithm, for converting analog voltage information into digital information that the collector node 106 can readily process and for analyzing the digital information.

In the illustrated embodiments, the transformer 402 (FIG. 4) or resistor circuit 502 (FIG. 5) converts a high voltage power line alternating current signal to a low voltage signal. While an analog-to-digital converter is shown in the illustrated embodiments, other techniques for performing such conversions may be utilized without departing from the scope of the invention. For example, a thermal technique may be used where the voltage in the power line heats a small element, whose temperature is monitored by the microprocessor. Disturbances in voltage lead to changes in temperature, which can be detected. An optical technique may also be used that includes a light emitting device that, when stimulated by the voltage, emits a light. A sensor on the microprocessor then detects this light which converts it into data which represents the voltage on the light emitter.

Figure 6:
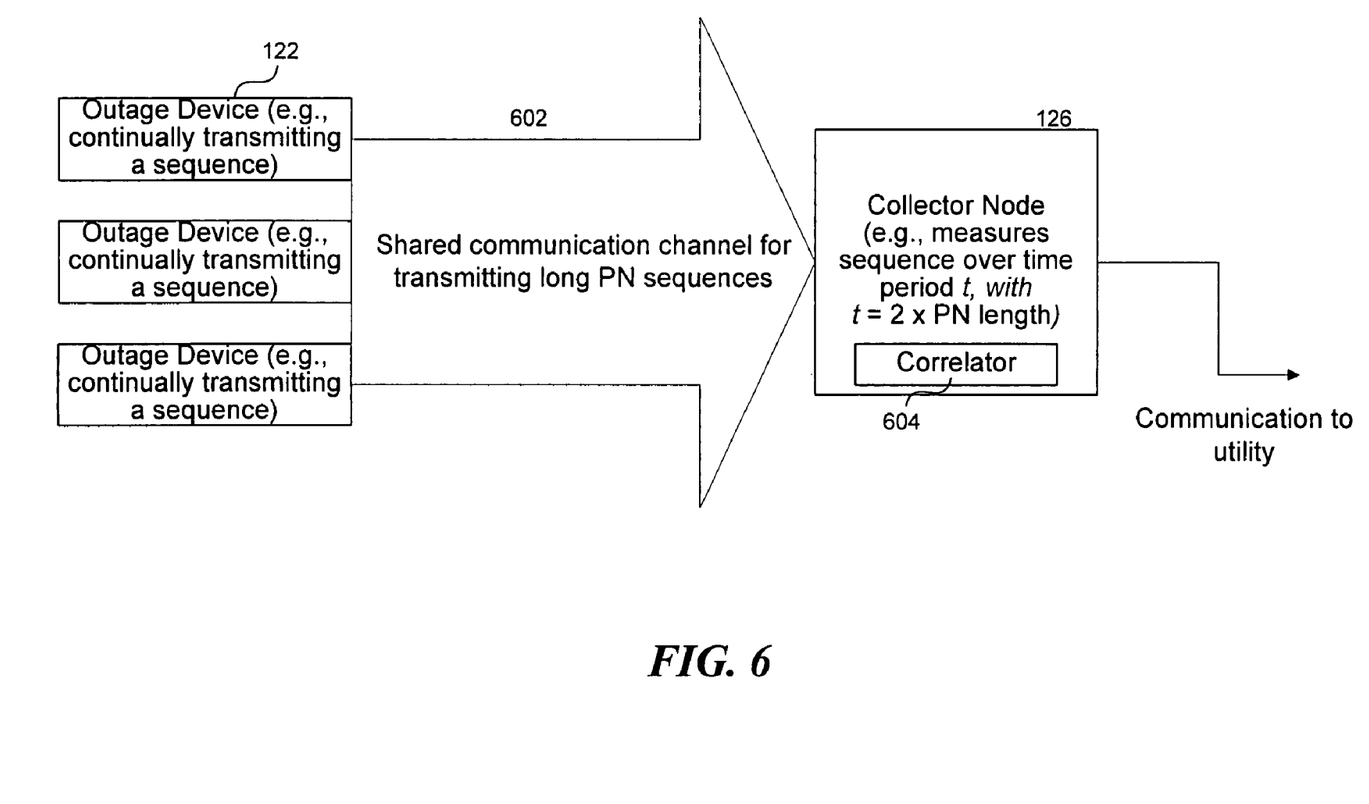
FIG. 6 is a block diagram showing a more detailed view of aspects of the system of FIG. 1B.

FIGS. 2-5 provide examples of the collector node 106 associated with the system of FIG. 1A, in which the collector node 106 is equipped to monitor quality of the utility in a relatively direct way (e.g., by being equipped with a voltage regulator, etc.). Alternatively, and as explained in more detail with respect to FIG. 6, the collector node 126 associated with the system of FIG. 1B is configured to receive quality monitoring data collected from a separate device, such as the outage device 122 of the system of FIG. 1B. For example, as shown in FIG. 6, multiple outage devices 122 may each, upon power up, continually transmit a long (e.g., greater than 256 bytes) preselected PN sequence on a given communication channel 602. The collector node 126 may include a correlator 604 or similar device that compares the received sequence with a known sequence, to determine if correlation is successful. For example, an outage or other disruption in utility quality may be present where the received sequence does not match the known sequence. In some embodiments, the correlator 604 is adapted to correlate each sequence over a time period equal to two times the PN sequence length. Accordingly, the number of outage devices 122 that can communicate with the collector node 126 over the same channel 602 may be a function of the PN sequence length as well.

Figure 7:
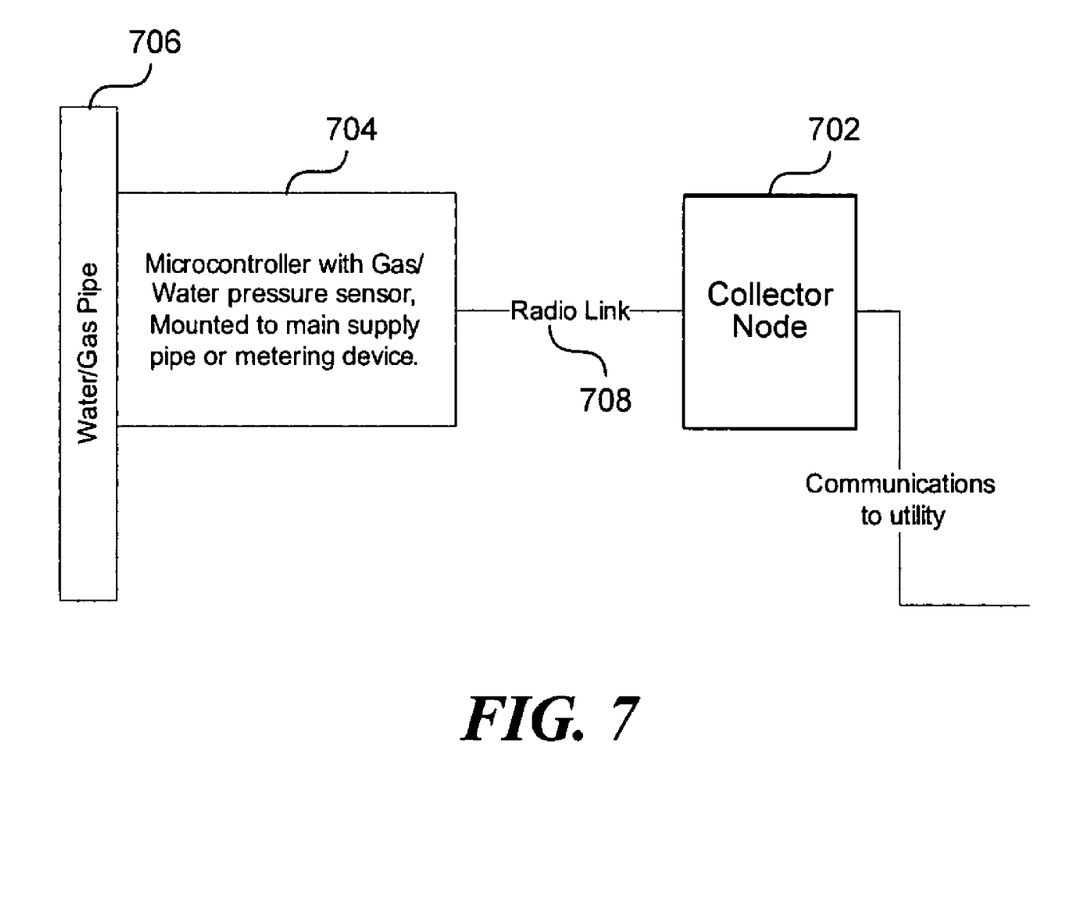
FIG. 7 is a block diagram showing a second example of a system on which the distributed quality monitoring technique can be implemented in one embodiment.

The system and method can monitor quality of other types of utilities such as water, gas, etc. For example, as shown in FIG. 7, water pressure may be measured at or near a collector node 702. With appropriate sensors (not shown) the system can also measure and report water temperature and/or water contaminants. Similar measurements could be taken with respect to gas systems.

Referring in more detail to FIG. 7, the implementation of the distributed quality in a non-electrical setting may utilize a slightly different configuration than the configuration illustrated with respect to FIGS. 1 through 6. For example, a microcontroller 704 with a gas/water pressure sensor may be mounted to a main supply pipe 706 or metering device. The collector node 702 can then collect this information via a radio link 708 or other communication link. The information is then transmitted to a utility provider system using a technique similar to that described previously with respect to FIGS. 1A through 6.

C. System Flows

The following flow diagrams show processes that occur within the system of FIGS. 1A and 1B, respectively. These flow diagrams do not show all functions or exchanges of data but, instead, provides an understanding of commands and data exchanged under the system. Those skilled in the relevant art will recognize that some functions or exchanges of commands and data may be repeated, varied, omitted, or supplemented, and other aspects not shown may be readily implemented. For example, while not described in detail, a message containing data may be transmitted through a message queue, over HTTP, etc.

Figure 8:
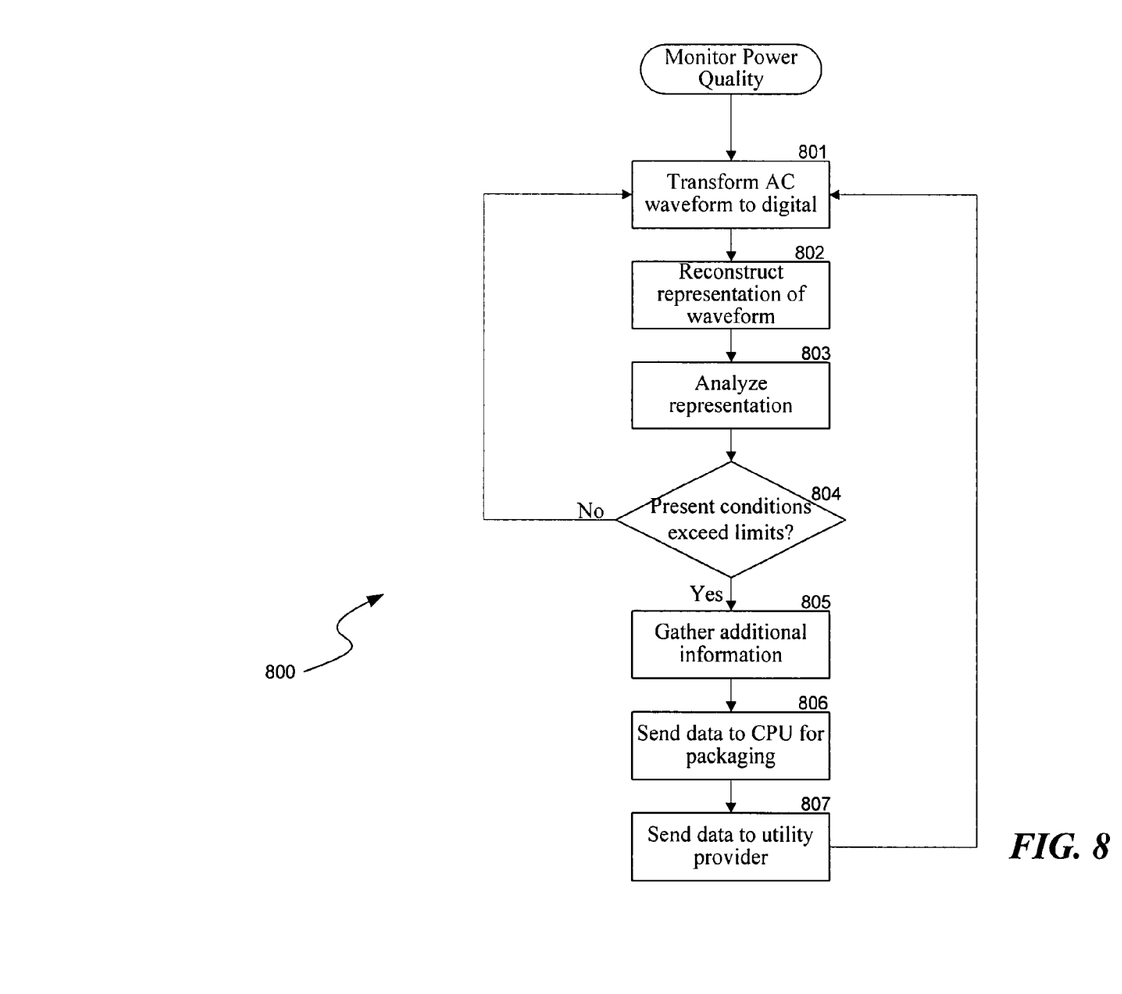
FIG. 8 is a flow diagram showing an example of a quality monitoring routine performed by the collector node of the system of FIG. 1A.

Referring to FIG. 8, a routine 800 for collecting utility supply quality information at the collector node, such as the collector node 106 of FIG. 1A, may begin with sensing voltage conditions at block 801. The details of this may vary. In some embodiments, a converter, such as the analog-to-digital converter 404 of FIGS. 4 and 5, processes a low voltage signal. It does this by transforming the waveform from a transformer (or resistor circuit) into a digital representation that the microprocessor can read. At block 802, the routine 800 takes this digital data and reconstructs a digital representation of the waveform. This function may occur at a microprocessor, such as the microprocessor 304 of FIG. 3. The digital representation contains information such as maximum and minimum voltage values. The digital representation may also contain information relating to the magnitude and duration of electrical disturbances on the power line, the frequency of the power line, power outages, power restoration, etc.

At block 803, the routine 800 analyzes the data or representation to determine whether any of the present conditions exceeds limits or specifications stored in memory. Again, this function may take place at the microprocessor. At decision block 804, if present conditions exceed limits known to the microprocessor, the routine proceeds at block 805, where the routine may gather additional information related to an abnormality (e.g., the value and duration of a low voltage condition) and package the information for consumption by a primary CPU in the collector node, such as the CPU 312 of FIG. 3. If, however, at decision block 804 the limits are not exceeded, the routine remains looping in the first four blocks (801-804). In some embodiments, the procedures outlined in the first three blocks (801-803) may occur on an ongoing basis until an event, such as a voltage anomaly, triggers a different path in the routine.

At block 806, the routine sends voltage information to the CPU for packaging so that it can be passed on to the utility provider. At block 807, the routine 800 sends the packaged data to utility provider. Regarding blocks 806 and 807, the routine 800 may cause a message containing quality data to be generated at the CPU shortly following an anomaly, or alternatively, at a predefined interval. In some embodiments, both are possible. For example, severe disturbances may require an immediate dispatch, while minor anomalies may be sent as part of a daily report.

In some embodiments, collected voltage data may be logged and then accessed as needed, instead of being accessed on a periodic basis or regular basis. For example, the voltage data may then be retrieved on a statistical basis for use as inputs for a model. In another example, the voltage data is retrieved in the event of a customer complaint. Such approaches limit voltage data processing. Alternatively, the main CPU may analyze the data and use it to check for a specific problem. If that problem is detected, a message could be sent. In some embodiments, the system may be placed in a monitor mode where it sends all data while the utility is then checking for anomalies at a remote site. Collected voltage data may also be used to "tune" the utility network, for example, by setting the voltage taps on a transformer to optimize the local voltage conditions.

Figure 9:
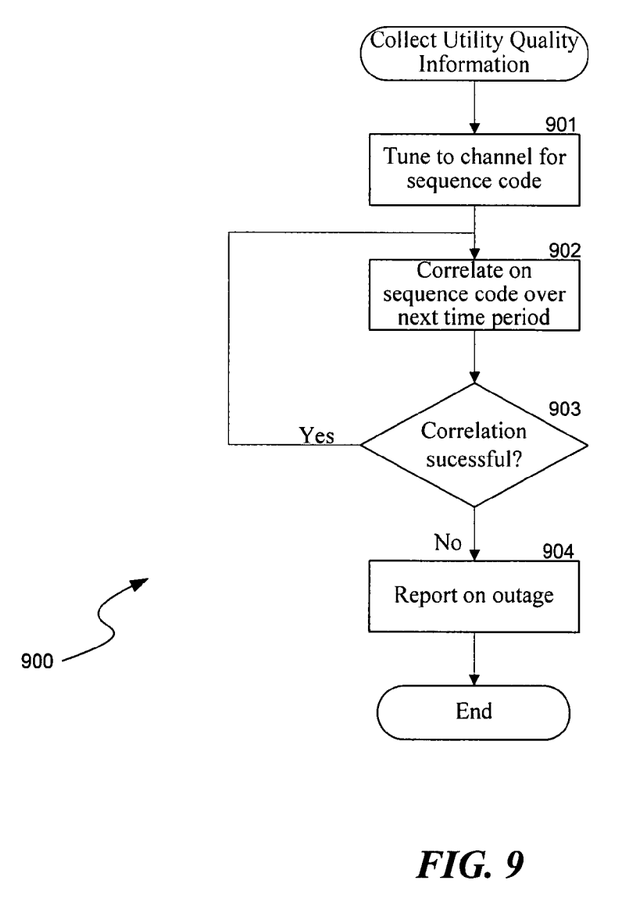
FIG. 9 is a flow diagram showing an example of a quality monitoring routine performed by the central receiver of the system of FIG. 1B.

Referring to FIG. 9, a routine 900 for receiving collected utility supply quality information at the collector node, such as the collector node 126 of FIG. 1B, may begin at block 901, where a receiver at the collector node tunes to a channel to receive sequence codes from one or more outage collection devices. In some embodiments, the sequence codes are relatively long in length (e.g., greater than 256 bytes) to allow as many devices as possible to operate on the same channel. At block 902, the routine 900 correlates each received sequence code over a first time period. (While correlation is used here as an example, other means for interpreting the sequence or signal may be used.) At decision block 903, if the correlation is successful (meaning, in this example that there is no detected outage or other quality problem with the utility), the routine 900 loops back to block 902 to correlate on the next received sequence for a next time period. If, however, at decision block 903, there the correlation is not successful, the routine 900 proceeds to block 904 to report the power outage. For example, the collector node may send outage information to a head end system, such as the head end system 120 of FIG. 1B.

While routine 900 of FIG. 9 is applied in the context of the system of FIG. 1B (where the outage information is collected by an outage device and transmitted to the collector node via the routine 900), the routine 900 may also be applied in the context of FIG. 1A, where the outage information is instead collected by an outage detection device at the collector node. In the scenario of FIG. 1A, the routine 900 (or a similar routine) would be used in providing information from the collector node to the head end system (or some other quality monitoring subsystem associated with the utility). Alternatively, aspects of the collector node of FIG. 1A and the outage detection devices of FIG. 1B could be combined together in a single device.

D. CONCLUSION

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps or components are presented in a given order, alternative embodiments may perform routines having steps or components in a different order. The teachings of the invention provided herein can be applied to other systems, not necessarily the distributed power monitoring system described herein. Based on the Detailed Description provided herein, those skilled in the relevant art can readily make and use a similar utility monitoring system for gas, water, etc., by e.g., substituting in a suitable gas quality monitoring module. The elements and acts of the various embodiments described above can be combined to provide further embodiments and some steps or components may be deleted, moved, added, subdivided, combined, and/or modified. Each of these steps may be implemented in a variety of different ways. Also, while these steps are shown as being performed in series, these steps may instead be performed in parallel, or may be performed at different times.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words in the above detailed description using the singular or plural number may also include the plural or singular number respectively. Additionally, the words "herein," "above," "below," and words of similar import, when used in this application, shall refer to this application as a whole and not to any particular portions of this application. When used in reference to a list of two or more items, the word "or" covers all of the following interpretations of the word: any of the items in the list, all of the items in the list, and any combination of the items in the list.

The teachings of the invention provided herein can be applied to other systems, not necessarily the system described herein. These and other changes can be made to the invention in light of the detailed description. The elements and acts of the various embodiments described above can be combined to provide further embodiments.

All of the above patents and applications are incorporated herein by reference. Aspects of the invention can be modified, if necessary, to employ the systems, functions, and concepts of the various references described above to provide yet further embodiments of the invention.

These and other changes can be made to the invention in light of the above detailed description. While the above description details certain embodiments of the invention and describes the best mode contemplated, no matter how detailed the above appears in text, the invention can be practiced in many ways. Details of the system may vary considerably in their implementation details, while still being encompassed by the invention disclosed herein. As noted above, particular terminology used when describing certain features, or aspects of the invention should not be taken to imply that the terminology is being re-defined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

We claim:

1. In a system for automatic meter reading of utility meters, a method for measuring a quality of a consumable utility, the method comprising:
   monitoring a supply of a utility, wherein the monitoring occurs in addition to receiving meter reading data from a telemetry device coupled to a utility meter, wherein the meter reading data includes an amount of the utility previously consumed;
   detecting if the supply of the utility is compromised; and
   providing an indication of whether the supply is compromised based on at least two measured parameters, wherein providing the indication occurs in addition to providing the received meter reading data to a central processor associated with the utility supply;
   wherein the system for automatic meter reading of utility meters is a fixed network meter reading system having multiple collector nodes, and
   wherein at least some collector nodes in the fixed network locally monitor the supply of the utility and provide an indication of whether the supply is compromised, without reliance on a signal from the telemetry device or the utility meter.

2. The method of claim 1 wherein detecting if the supply is compromised includes:
   transforming an alternating current waveform to a digital signal, wherein the alternating current waveform is received from an electrical power generating source;
   reconstructing the digital signal into a digital representation of the alternating current waveform;
   analyzing the digital representation; and
   determining if at least a portion of the digital representation exceeds at least one predetermined threshold.

3. The method of claim 1 wherein monitoring the supply includes:
   receiving a coded sequence from a utility supply monitoring component, wherein the utility supply monitoring component is configured to monitor a supply of a utility, wherein the received coded sequence corresponds to the monitoring, and wherein the coded sequence is transmitted substantially continuously;
   at a collector node, correlating the received coded sequence; and
   if the correlation is unsuccessful, determining that the supply of the utility is compromised.

4. The method of claim 1 wherein providing an indication of whether the supply is compromised includes reporting a detected outage of the supply of the utility immediately following the detected outage.

5. A computer-readable storage medium containing computer-executable instructions for performing a method for measuring the quality or presence of a supply of a utility in a system for automatic meter reading of utility meters, the method comprising:
   at a collector node, receiving a coded sequence from a utility supply monitoring component, wherein the utility supply monitoring component is configured to monitor a supply of the utility, wherein the received coded sequence corresponds to the monitoring, and wherein the coded sequence is transmitted substantially continuously;

at the collector node, receiving additional coded sequences, wherein the received coded sequence and the additional coded sequences are received at the collector node as continuously transmitted over a single channel to the collector node;

at the collector node, correlating the received coded sequence to a known sequence;

if the correlation is unsuccessful, determining that the supply of the utility is compromised; and transmitting an alert message indicating that the supply of the utility is compromised if the correlation is unsuccessful.

6. The computer-readable storage medium of claim 5 wherein the method further comprises sending a report to a head end system via a network, wherein the report indicates the quality of the supply based on the correlation.

7. The computer-readable storage medium of claim 5 wherein the method further comprises, receiving meter reading data associated with consumption of the utility at the collector node.

8. The computer-readable storage medium of claim 5 wherein the coded sequence includes a pseudo-random number code sequence.

9. The computer-readable storage medium of claim 5 wherein the coded sequence includes a pseudo-random number code sequence having a predetermined length, and wherein the correlation is performed based on a time period equal to twice the length of the pseudo-random number code sequence.

* * * * *

UNITED STATES PATENT AND TRADEMARK OFFICE
CERTIFICATE OF CORRECTION

PATENT NO. : 7,283,916 B2  Page 1 of 1
APPLICATION NO. : 11/175963
DATED : October 16, 2007
INVENTOR(S) : Cahill-O'Brien et al.

It is certified that error appears in the above-identified patent and that said Letters Patent is hereby corrected as shown below:

In column 1, line 36, after "utility" delete ",".

Signed and Sealed this

First Day of July, 2008

JON W. DUDAS
*Director of the United States Patent and Trademark Office*